United States Patent

Okawa et al.

[11] Patent Number: 5,851,102
[45] Date of Patent: Dec. 22, 1998

[54] DEVICE AND METHOD FOR POSITIONING A NOTCHED WAFER

[75] Inventors: Takashi Okawa, Fujioka; Shigeharu Iizuka, deceased, late of Hadano, both of Japan, by Kazumi Iizuka, Toshiki Iizuka, legal representatives

[73] Assignee: Hitachi Electronics Engineering Co., Ltd., Japan

[21] Appl. No.: 931,549

[22] Filed: Sep. 16, 1997

[30] Foreign Application Priority Data

Sep. 17, 1996 [JP] Japan .................................. 8-266695

[51] Int. Cl.⁶ .................................................. B65G 47/24
[52] U.S. Cl. ........................................... 414/783; 414/936
[58] Field of Search ........................ 198/394; 414/783, 414/936, 941

[56] References Cited

U.S. PATENT DOCUMENTS

| | | | |
|---|---|---|---|
| 4,685,206 | 8/1987 | Kobayashi et al. | 414/936 X |
| 4,887,904 | 12/1989 | Nakazato et al. | 198/394 X |
| 4,938,654 | 7/1990 | Schram | 198/394 D X |
| 5,125,791 | 6/1992 | Volovich | 198/394 X |
| 5,308,222 | 5/1994 | Bacchi et al. | 414/936 X |

FOREIGN PATENT DOCUMENTS 63-266850  11/1988  Japan .................................. 414/936

*Primary Examiner*—Janice L. Krizek
*Attorney, Agent, or Firm*—Graham & James LLP

[57] ABSTRACT

A detector is provided to optically monitor the outer periphery of a wafer rotated by rotation of a rotary stage, so as to detect how much the center of the wafer placed on the rotary inspection stage is offset from the rotational center of the rotary stage as well as an angular position, on the stage, of a V-shaped notch formed in the wafer. From the detected eccentricity of the wafer, it is determined whether a precise positioning operation, using at least three positioning pins, to locate the center of the wafer at the rotational center of the rotary stage should be performed or not. When the detected eccentricity is so great as to necessitate the precise positioning operation, one of the positioning pins is caused to fit into the V-shaped notch of the wafer on the basis of the detected angular position of the notch and then the precise positioning of the wafer is performed using the other two positioning pins. In this manner, the wafer can be properly positioned so that the center of the wafer lies exactly at the rotational center of the rotary stage, using the at least three positioning pins.

6 Claims, 2 Drawing Sheets

DEVICE AND METHOD FOR POSITIONING A NOTCHED WAFER

BACKGROUND OF THE INVENTION

The present invention relates to an improved device and method for positioning a notched wafer on a rotary inspection table of a wafer surface inspecting device which uses a laser to detect microscopic foreign substances resting on the wafer surface.

In manufacturing high-quality, high-performance semiconductor devices such as LSIs (hereinafter referred to as a "semiconductor manufacturing process"), reduction of "yield" due to presence of microscopic foreign substances on a wafer surface has become an increasingly serious problem along with increasing tendencies toward micronization of circuit patterns and an increase in the number of layers to be connected by wiring. Thus, a technique for directly or indirectly inspecting a wafer surface during the semiconductor manufacturing process is now essential in the semiconductor manufacturing process.

Today, microscopic foreign substances resting on a wafer surface are detected with high accuracy by a laser-type wafer surface inspecting device, which, while rotating the wafer, irradiates a laser beam onto the wafer surface for optically scanning the surface from the center to outer periphery of the wafer. For this purpose, it is absolutely necessary that the center of the wafer be accurately positioned at (i.e., aligned with) the rotational center of a rotary inspection table or stage of the device.

In recent years, the surface inspection is often carried out on so-called "notched" wafers having a V-shaped notch, about 1 mm in depth, formed in its outer periphery, rather than having a positioning guide, commonly called an "orientation flat", formed in part of its outer periphery. For the notched wafer, it is necessary to know where on the rotary inspection stage the V-shaped notch should be positioned, i.e., an angular position of the notch on the stage. In positioning the entire wafer on the rotary inspection stage, it has been conventional to first preposition the V-shaped notch and then accurately position the wafer center at the rotational center of the stage. However, with a tendency to higher integration of semiconductor devices, there has been encountered a certain limit to the wafer positioning accuracy.

SUMMARY OF THE INVENTION

It is therefore an object of the present invention to provide a device and method which, in a semiconductor manufacturing process, permit accurate positioning of a notched wafer in such a manner that the center of the wafer exactly lies at the rotational center of a rotary stage of a laser-type wafer surface inspecting device, in order to provide for a precise detection of microscopic foreign substances resting on the wafer surface.

In order to accomplish the above-mentioned object, the present invention provides an improved notched wafer positioning device which comprises: a rotary stage rotatable with a wafer placed thereon, the wafer having a V-shaped notch formed in a predetermined location of an outer periphery thereof; at least three positioning pins provided outwardly of the outer periphery of the wafer placed on the rotary stage and movable into contact with the wafer; a detector for monitoring the outer periphery of the wafer that is rotated by rotation of the rotary stage, so as to detect an angular position of the V-shaped notch of the wafer on the rotary stage and eccentricity of the wafer relative to a rotational center of the rotary stage; and a controller for positioning the V-shaped notch of the wafer at a location corresponding to a predetermined one of the positioning pins on the basis of the angular position of the V-shaped notch detected by the detector and for moving each of the positioning pins into contact with the wafer on the basis of the eccentricity of the wafer detected by the detector so that a center of the wafer lies at the rotational center of the rotary stage.

From the detected eccentricity of the wafer, it is determined whether a precise positioning operation, using the at least three positioning pins, to locate the center of the wafer at the rotational center of the rotary stage should be performed or not. When the detected eccentricity is so great as to necessitate the precise positioning operation, one of the positioning pins is caused to fit into the V-shaped notch of the wafer on the basis of the detected angular position of the notch and then the precise positioning of the wafer can be performed using the other two positioning pins. This arrangement eliminates the conventional need for placing the wafer on the rotary stage while properly positioning the V-shaped notch and permits precise positioning after the wafer has been placed on the rotary stage. Further, because the angular position of the V-shaped notch on the rotary stage has been detected, it is possible to easily recognize every varying position of the wafer surface even when a laser wafer surface inspects the wafer surface while rotating the wafer.

BRIEF DESCRIPTION OF THE DRAWINGS

For better understanding of the above and other features of the present invention, the preferred embodiments of the invention will be described in greater detail below with reference to the accompanying drawings, in which.

DETAILED DESCRIPTION OF THE PREFERRED EMBODIMENTS

Figure 1A:
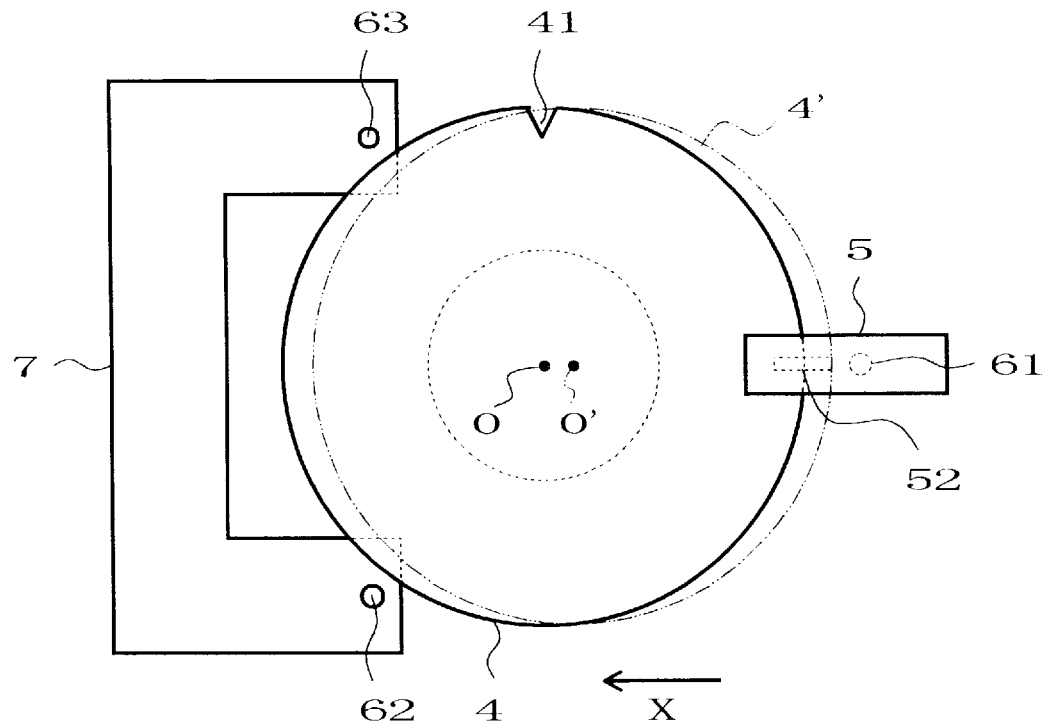
FIG. 1A is a schematic plan view of a rotary inspection stage in a notched wafer positioning device according to a preferred embodiment of the present invention.
Figure 1B:
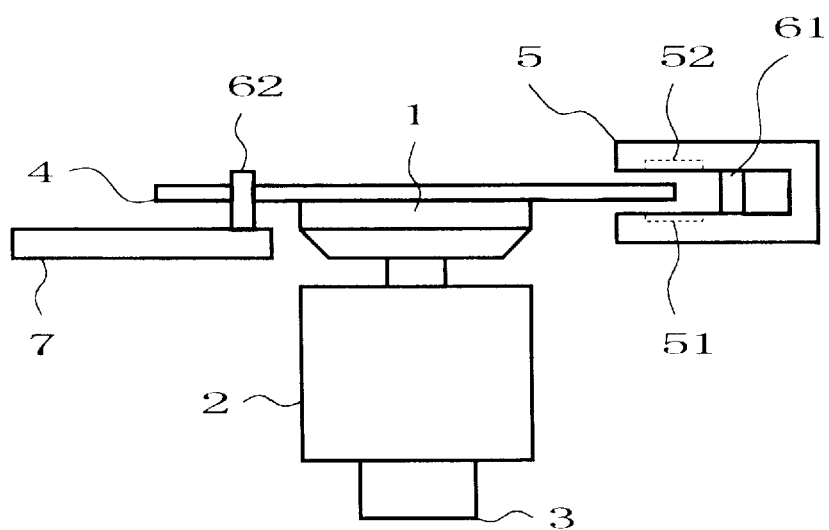
FIG. 1B is a side view of the rotary inspection stage.
Figure 2A:
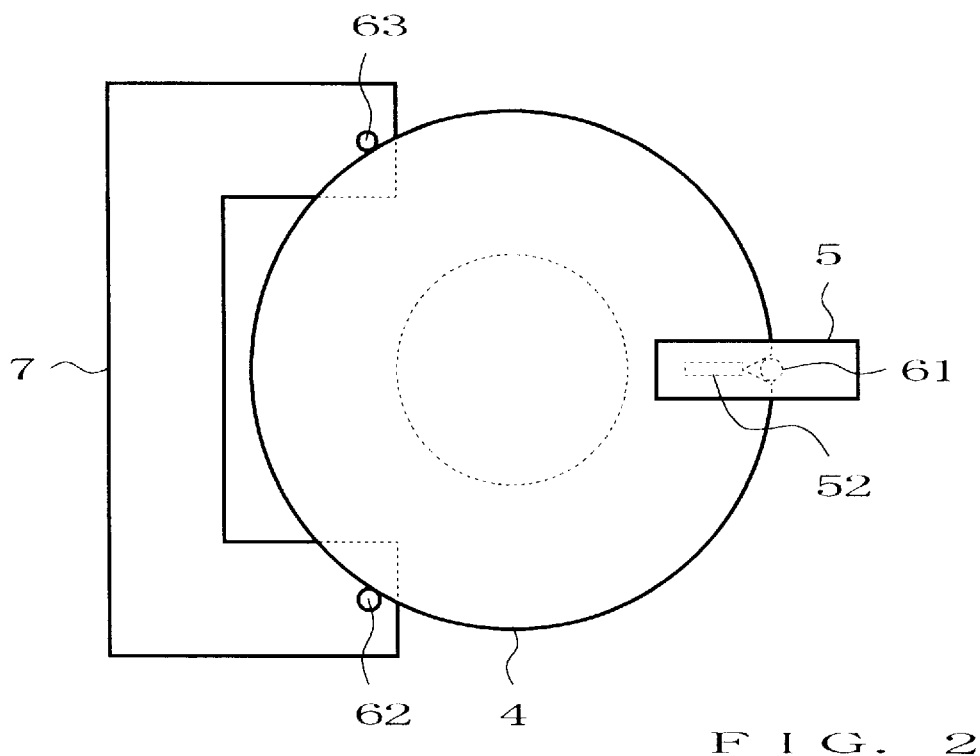
FIGS. 2A and 2B are schematic views of the rotary inspection stage, showing a manner in which a precise positioning operation is performed in the preferred embodiment.
Figure 2B:
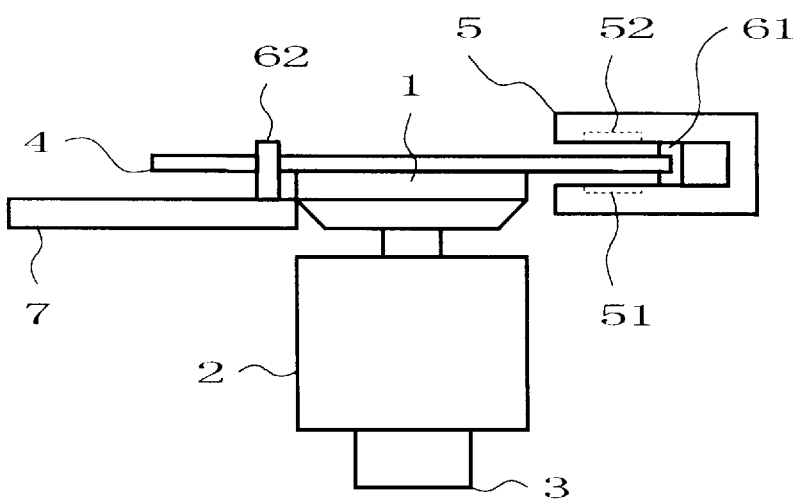

FIG. 1A is a plan view of a rotary inspection stage in a notched wafer positioning device according to a preferred embodiment of the present invention which is applied to a wafer surface inspecting device, and FIG. 1B is a side view of the rotary inspection stage. In the illustrated embodiment, the rotary inspection stage 1 is driven to rotate by means of a motor 2. An encoder 3 is attached to the motor 2, which allows a user to recognize a sequentially changing angular position of the rotary inspection stage 1 on the basis of output signals from the encoder 3.

On the rotary inspection stage 1, there is provided a chucking section (not shown) which, by suction, sticks to a surface of a notched wafer 4 to thereby fix the wafer 4 on the stage 1. The notched wafer 4 contained in a wafer cassette is delivered to the rotary inspection stage 1 by means of a handling arm or otherwise, and then positioned on the stage 1 in such a manner that the center of the notched wafer 4 lies at or is aligned with the rotational axis of the rotary inspection stage 1. However, even with the handling arm capable of providing a very high positioning accuracy, it is extremely difficult to accurately position the center of the notched wafer 4 at the rotational axis of the rotary inspection stage 1.

To facilitate the accurate positioning of the notched wafer 4, the preferred embodiment of the present invention employs an eccentricity detector 5, having a positioning pin 61, to detect how much the center of the wafer 4 placed on the rotary inspection stage 1 is offset or deviates from the rotational center of the stage 1 (i.e., eccentricity of the wafer relative to the rotational center of the rotary inspection stage 1) as well as an angular position, on the stage 1, of a V-shaped notch 41 formed in a predetermined location of the wafer's outer periphery.

More specifically, the eccentricity detector 5 includes a light source 51, and a CCD (Charge Coupled Device) linear sensor 52, opposed to the light source 51 with the notched wafer 4 interposed therebetween, for receiving illuminating light from the light source 51. As the rotary inspection stage 1 is rotated with the notched wafer 4 placed thereon, the CCD linear sensor 52 continuously detects the outer periphery of the rotating wafer 4. In this manner, it is possible to detect every changing position of the V-shaped notch 41 of the wafer 4 and also detect how much the center of the wafer 4 on the rotary inspection stage 1 is offset from the rotational center axis of the stage 1. In FIG. 1, solid line represents the wafer 4 when its center lies exactly at the rotational center 0 of the rotary stage 1, while phantom line 4' represents the wafer 4 when its center 0' is offset rightward from the rotational center 0.

The positioning pin 61 is movable into contact with the outer periphery of the notched wafer 4 to position the center of the wafer 4 at the rotational center of the rotary inspection stage 1, in conjunction with two positioning pins 62 and 63 provided on a positioning device 7. Namely, when a detected eccentricity of the notched wafer 4 is within a predetermined tolerance, the wafer surface inspecting device detects microscopic foreign substances on the wafer surface without performing a precise wafer positioning operation of the invention. However, when the detected eccentricity of the notched wafer 4 is greater than the predetermined tolerance, the precise wafer positioning operation of the invention is performed; that is, the eccentricity detector 5 and positioning device 7 are moved gradually toward the rotary inspection stage 1. More specifically, the positioning pin 61 of the eccentricity detector 5 is moved in the direction of arrow X (i.e., leftward in FIG. 1), while the positioning device 7, i.e., the positioning pins 62 and 63 on the positioning device 7 are moved in an opposite direction to arrow X (i.e., rightward in FIG. 1).

At that time, the positioning device 7 is moved rightward and stopped at a particular position determined by the rotational center of the rotary stage 1 and the radius of the wafer 4, to thereby position the wafer 4. The particular position determined by the rotational center of the rotary stage 1 and the radius of the wafer 4 is where the distance, from the rotational center of the stage 1, of each of the positioning pins 62 and 63 equals the radius of the wafer 4.

Because the wafer positioning technique based on the three point contact described above is well known in the art, mechanisms and control for moving the eccentricity detector 5 and positioning device 7 will be explained here only briefly. Namely, the eccentricity detector 5 is driven to move in the direction of arrow X along a line connecting between the rotational center 0 of the rotary stage 1 and the positioning pin 61 so that the movement of the detector 5 in the X direction causes the pin 61 to move toward the rotational center 0. The positioning device 7 is driven to move in the opposite direction to arrow X so that the pins 62 and 63 are caused to move in parallel into contact with the outer periphery of the wafer 4.

At that time, the angular position of the rotary inspection stage 1 is controlled in such a manner that the positioning pin 61 of the eccentricity detector 5 is fitted in the notched portion 41 of the wafer 4.

In this manner, the positioning pin 61 of the eccentricity detector 5 and the positioning pins 62 and 63 of the positioning device 7 are brought into contact with the wafer 4 at three separate points along the outer periphery of the notched wafer 4. Because the positioning pin 61 of the eccentricity detector 5 is fitted in the V-shaped notch 41, the notched wafer 4 can be accurately positioned at the rotational center of the inspection stage 1 against sliding displacement in the circumferential direction of the wafer 4. It should be obvious that during the positioning control through the movement of the positioning pins 61 to 63, the notched wafer 4 is released from the suction force from the chucking section so as to be able to move freely relative to the rotary inspection stage 1.

The positioning control according to the above-described embodiment may be applied to notched wafers 4 of various different sizes rather than those of a same size. In this case, it is only necessary that the respective positions of or distance between the positioning pins 62 and 63 be varied depending on the size of each wafer to be inspected.

Further, whereas the preferred embodiment has been described in relation to a case where the eccentricity detector 5 has the positioning pin 61, such a positioning pin 61 need not necessarily be provided on the detector 5 if accurate relative positional relationships between the positioning pins 61 to 63 and the eccentricity detector 5 are known in advance. However, the provision of the positioning pin 61 on the eccentricity detector 5 advantageously eliminates a need for arithmetic operations to determine the relative positional relationships, because precise positioning can be easily conducted once the positioning pin 61 comes into fitting engagement with the V-shaped notch 41.

In summary, the notched wafer positioning device arranged in the above-mentioned manner permits accurate positioning of a notched wafer such that the center of the wafer lies at the center of the rotary stage of the laser-type wafer surface inspecting device.

What is claimed is:

1. A notched wafer positioning device comprising:
    a rotary stage rotatable with a wafer placed thereon, said wafer having a V-shaped notch formed in a predetermined location of an outer periphery thereof;
    at least three positioning pins provided outwardly of the outer periphery of the wafer placed on said rotary stage and movable into contact with the wafer;
    a detector for monitoring the outer periphery of the wafer that is rotated by rotation of said rotary stage, so as to detect an angular position of the V-shaped notch of the wafer on said rotary stage and eccentricity of the wafer relative to a rotational center of said rotary stage; and
    a controller for positioning the V-shaped notch of the wafer at a location corresponding to a predetermined one of said positioning pins on the basis of the angular position of the V-shaped notch detected by said detector and for moving each of said positioning pins into contact with the wafer on the basis of the eccentricity of the wafer detected by said detector so that a center of the wafer lies at the rotational center of said rotary stage.

2. A notched wafer positioning device as recited in claim 1 wherein said detector includes an optical sensor for monitoring the V-shaped notch of the wafer and a position sensor for detecting an angular position of said rotary stage.

3. A notched wafer positioning device as recited in claim 2 wherein said predetermined one of said positioning pins is fixed at a predetermined position relative to said optical sensor.

4. A notched wafer positioning device as recited in claim 1 wherein said rotary stage is a rotary inspection table of a wafer surface inspecting device.

5. A method for positioning a wafer on a rotary stage with a center of the wafer aligned with a rotational center of the rotary stage, the wafer having a V-shaped notch formed in a predetermined location of an outer periphery thereof, said method comprising the steps of:

- placing the wafer on said rotary stage, at least three positioning pins being provided outwardly of the outer periphery of the wafer placed on said rotary stage;
- monitoring the outer periphery of the wafer that is rotated by rotation of said rotary stage, so as to detect an angular position of the V-shaped notch of the wafer on said rotary stage and eccentricity of the wafer relative to the rotational center of said rotary stage;
- positioning the V-shaped notch of the wafer on said rotary stage at an angular position corresponding to a predetermined one of said positioning pins on the basis of the angular position of the V-shaped notch detected by the step of monitoring; and
- on the basis of the eccentricity of the wafer detected by the step of monitoring, moving each of said positioning pins into contact with the wafer in such a manner that the center of the wafer lies at the rotational center of said rotary stage, wherein movement of said predetermined one of said positioning pins is in a diametric direction of said rotary stage.

6. A method for positioning a wafer on a rotary stage with a center of the wafer aligned with a rotational center of the rotary stage, the wafer having a V-shaped notch formed in a predetermined location of an outer periphery thereof, said method comprising the steps of:

- placing the wafer on said rotary stage, at least three positioning pins being provided outwardly of the outer periphery of the wafer placed on said rotary stage;
- monitoring the outer periphery of the wafer that is rotated by rotation of said rotary stage, so as to detect an angular position of the V-shaped notch of the wafer on said rotary stage and eccentricity of the wafer relative to the rotational center of said rotary stage;
- on the basis of the eccentricity of the wafer detected by the step of monitoring, determining whether a positioning operation to locate the center of the wafer at the rotational center of said rotary stage should be performed or not; and
- when it is determined that said positioning operation should be performed, fitting a predetermined one of said positioning pins into the V-shaped notch of the wafer placed on said rotary stage and moving each of said positioning pins into contact with the wafer on the basis of the eccentricity of the wafer detected by said detector, so as to position the wafer in such a manner that the center of the wafer lies at the rotational center of said rotary stage.

* * * * *